United States Patent
Chen et al.

(10) Patent No.: US 12,113,094 B2
(45) Date of Patent: Oct. 8, 2024

(54) ELECTRONIC DEVICE

(71) Applicant: InnoLux Corporation, Miao-Li County (TW)

(72) Inventors: Jia-Yuan Chen, Miao-Li County (TW); Tsung-Han Tsai, Miao-Li County (TW); Kuan-Feng Lee, Miao-Li County (TW); Yuan-Lin Wu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/177,289

(22) Filed: Mar. 2, 2023

(65) Prior Publication Data

US 2023/0215908 A1    Jul. 6, 2023

Related U.S. Application Data

(63) Continuation of application No. 17/501,381, filed on Oct. 14, 2021, now Pat. No. 11,616,096, which is a
(Continued)

(51) Int. Cl.
*H01L 27/15*  (2006.01)
*H01L 25/075*  (2006.01)
(Continued)

(52) U.S. Cl.
CPC .......... *H01L 27/156* (2013.01); *H01L 33/005* (2013.01); *H01L 33/22* (2013.01); *H01L 33/44* (2013.01); *H01L 33/46* (2013.01); *H01L 33/507* (2013.01); *H01L 33/58* (2013.01); *H01L 33/60* (2013.01); *H10K 50/844* (2023.02); *H10K 50/854* (2023.02); *H10K 50/856* (2023.02); *H10K 50/865* (2023.02); *H10K 59/122* (2023.02); *H10K 59/127* (2023.02); *H10K 59/173* (2023.02); *H10K 59/38* (2023.02); *H10K 71/00* (2023.02); *H01L 2933/0025* (2013.01);
(Continued)

(58) Field of Classification Search
CPC . H01L 27/156; H01L 25/0753; H01L 33/005; H01L 33/22; H01L 33/44; H01L 33/46; H01L 33/504; H01L 33/507; H01L 33/58; H01L 33/60; H10K 50/844; H10K 50/854; H10K 50/865; H10K 59/1201; H10K 59/122; H10K 59/127; H10K 59/30; H10K 59/351; H10K 59/38
See application file for complete search history.

(56) References Cited

U.S. PATENT DOCUMENTS

2015/0001576 A1 * 1/2015 Iwata ................. H10K 50/8445
                                                      438/26
2015/0108512 A1 * 4/2015 Shimayama ....... H10K 59/1275
                                                      257/88
(Continued)

*Primary Examiner* — Omar F Mojaddedi
(74) *Attorney, Agent, or Firm* — McClure, Qualey & Rodack, LLP

(57) ABSTRACT

An electronic device includes a substrate, a first light-emitting unit, a first light conversion unit, and a first buffer layer. The first light-emitting unit is disposed on the substrate. The first light conversion unit is disposed on the first light-emitting unit. The first buffer layer is disposed between the first light conversion unit and the first light-emitting unit. The thickness of the first light conversion unit is greater than the thickness of the first light-emitting unit.

9 Claims, 14 Drawing Sheets

Related U.S. Application Data continuation of application No. 16/169,098, filed on Oct. 24, 2018, now abandoned.

(51) Int. Cl.

| | |
|---|---|
| *H01L 33/00* | (2010.01) |
| *H01L 33/22* | (2010.01) |
| *H01L 33/34* | (2010.01) |
| *H01L 33/44* | (2010.01) |
| *H01L 33/46* | (2010.01) |
| *H01L 33/50* | (2010.01) |
| *H01L 33/58* | (2010.01) |
| *H01L 33/60* | (2010.01) |
| *H10K 50/844* | (2023.01) |
| *H10K 50/85* | (2023.01) |
| *H10K 50/854* | (2023.01) |
| *H10K 50/856* | (2023.01) |
| *H10K 50/86* | (2023.01) |
| *H10K 59/122* | (2023.01) |
| *H10K 59/127* | (2023.01) |
| *H10K 59/173* | (2023.01) |
| *H10K 59/38* | (2023.01) |
| *H10K 71/00* | (2023.01) |
| *H10K 59/12* | (2023.01) |

(52) U.S. Cl.
CPC ............... *H01L 2933/0041* (2013.01); *H01L 2933/0058* (2013.01); *H10K 59/1201* (2023.02)

(56) References Cited

U.S. PATENT DOCUMENTS

2017/0250233 A1\* 8/2017 Ushikubo ............ H10K 59/876
2018/0197923 A1\* 7/2018 Kashiwabara ........ H01L 27/153
2018/0224694 A1\* 8/2018 Tae ........................ H10K 59/38

\* cited by examiner

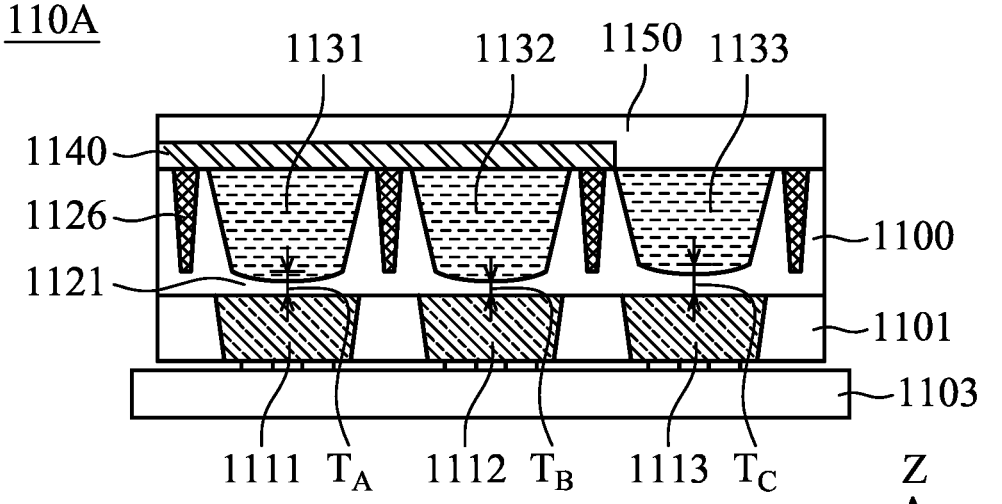
FIG. 11
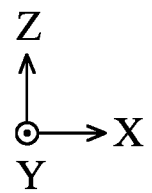

ELECTRONIC DEVICE

CROSS-REFERENCE TO RELATED APPLICATIONS

This application is a Continuation of application Ser. No. 17/501,381, filed Oct. 14, 2021, which is a Continuation of application Ser. No. 16/169,098, filed Oct. 24, 2018, the entirety of which is incorporated by reference herein.

BACKGROUND

Field of the Disclosure

The disclosure relates to electronic devices, and in particular to an electronic device having a buffer layer disposed between light-emitting units and light conversion units.

Description of the Related Art

As digital technology develops, display devices are used more widely in many aspects of daily life, such as in televisions, notebook computers, computers, cell phones, smartphones, and other modern information devices. Also, display devices are continuously developed to be lighter, thinner, smaller and more fashionable than previous generations.

However, a display device that can increase display quality or reliability is still required in the industry.

BRIEF SUMMARY

Some embodiments of the disclosure provide an electronic device, including: a substrate, a first light-emitting unit, a first light conversion unit, and a first buffer layer. The first light-emitting unit is disposed on the substrate. The first light conversion unit is disposed on the first light-emitting unit. The first buffer layer is disposed between the first light conversion unit and the first light-emitting unit. The thickness of the first light conversion unit is greater than the thickness of the first light-emitting unit.

Some embodiments of the disclosure provide an electronic device, including: a substrate, a first electronic unit, a second electronic unit, a first buffer layer, and a second buffer layer. The first electronic unit is disposed on the substrate. The second electronic unit is disposed on the substrate and adjacent to the first electronic unit. The first buffer layer is disposed on the first electronic unit and has a first curved bottom surface. The second buffer layer is disposed on the second electronic unit and has a second curved bottom surface. The width of the first curved bottom surface is different from the width of the second curved bottom surface.

To clarify the features and advantages of the present disclosure, a detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 11 is a cross-sectional view illustrating the display device in accordance with some other embodiments of the present disclosure.

DETAILED DESCRIPTION

Figure 1A:
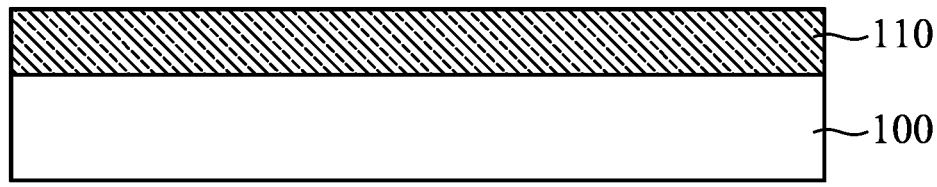
FIGS. 1A-1G are cross-sectional views illustrating a fabrication process of a display device in accordance with some embodiments of the present disclosure.

The display devices in accordance with some embodiments are described in detail in the following description. It should be appreciated that in the following detailed description provides various embodiments and examples in order to perform various configurations of some embodiments of the present disclosure. The specific elements and configurations described in the following detailed description are set forth in order to clearly describe some embodiments of the present disclosure. It will be apparent that the exemplary embodiments set forth herein are used merely for the purpose of illustration, and the inventive concept may be embodied in various forms without being limited to those exemplary embodiments. In addition, the drawings of different embodiments may use repeated numerals or marks. Those repetitions are merely in order to clearly describe some embodiments of the present disclosure. However, the use of repeated numerals in the drawings of different embodiments does not suggest any correlation between different embodiments and/or configurations. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

In addition, in this specification, relative expressions may be used. For example, "lower", "bottom", "higher" or "top" are used to describe the position of one element relative to another. It should be appreciated that if a device is flipped upside down, an element that is "lower" will become an element that is "higher".

It should be understood that, although the terms "first", "second", "third" etc. may be used herein to describe various elements, components, regions, layers and/or portions, and these elements, components, regions, layers, and/or portions should not be limited by these terms. These terms are only used to distinguish one element, component, region, layer, or portion. Thus, a first element, component, region, layer or portion discussed below could be termed a second element, component, region, layer or portion without departing from the teachings of some embodiments of the present disclosure.

Unless defined otherwise, all the terms (including technical and scientific terms) used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined in the present disclosure.

This description of the exemplary embodiments is intended to be read in connection with the accompanying drawings, which are to be considered part of the entire written description. It should be appreciated that the drawings are not drawn to scale. The shape and the thickness of embodiments may be exaggerated in the drawings to clarify the features of the present disclosure. In addition, structures and devices are shown schematically in order to clarify the features of the present disclosure.

Figure 1B:
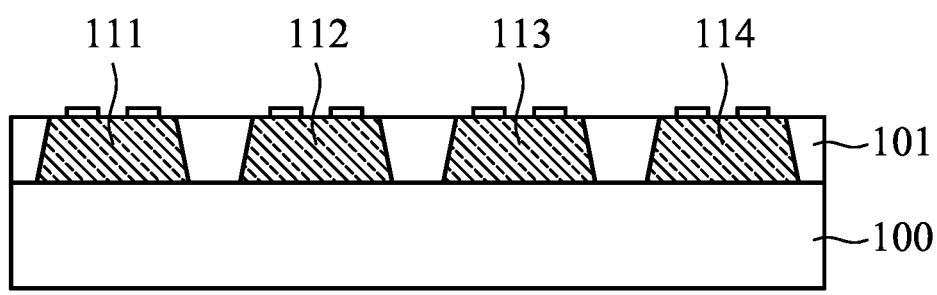

Referring to FIGS. 1A-1G, FIGS. 1A-1G are cross-sectional views illustrating a fabrication process of a display device 10A or 10B in accordance with some embodiments of the present disclosure. As shown in FIG. 1A, a growth substrate 100 is provided, and a light-emitting layer 110 is disposed on the growth substrate 100. For example, the growth substrate 100 may be a silicon substrate, but it is not limited thereto. Then, as shown in FIG. 1B, an etching process may be performed on the light-emitting layer 110, and a first light-emitting unit 111, a second light-emitting unit 112, a third light-emitting unit 113, and a fourth light-emitting unit 114 are formed. It should be noted that the etching process performed herein may include wet etching process, dry etching process, a combination thereof, or any other suitable etching process, and the detail discussion of all the etching process herein will not be further provided in the following paragraphs.

Also, electrodes may be disposed on the first light-emitting unit 111, the second light-emitting unit 112, the third light-emitting unit 113 and, the fourth light-emitting unit 114. For example, the material of the electrodes may include a conductive material, such as metal or polymer, but the present disclosure is not limited thereto. An insulating layer 101 may be formed between the first light-emitting unit 111, the second light-emitting unit 112, the third light-emitting unit 113, and the fourth light-emitting unit 114. For example, the material of the insulating layer 101 may include resin, but it is not limited thereto.

It should be noted that for the sake of simplicity, the first light-emitting unit 111, the second light-emitting unit 112, the third light-emitting unit 113, and the fourth light-emitting unit 114 may be referred to as "the light-emitting units" in the following description. Similarly, all the components and/or layers herein (such as buffer layers and light conversion units as follows), which are distinguished by using the terms "first", "second", "third", etc., may be simplified in the aforementioned manner. The light-emitting unit in the present disclosure may include liquid crystals (LC), organic light-emitting diodes (OLED), mini light-emitting diodes (mini LED), micro light-emitting diodes (micro LED), quantum dot light-emitting diodes (QLED), quantum dots (QD), phosphors, fluorescence or other display elements, and it is not limited thereto.

Figure 1C:
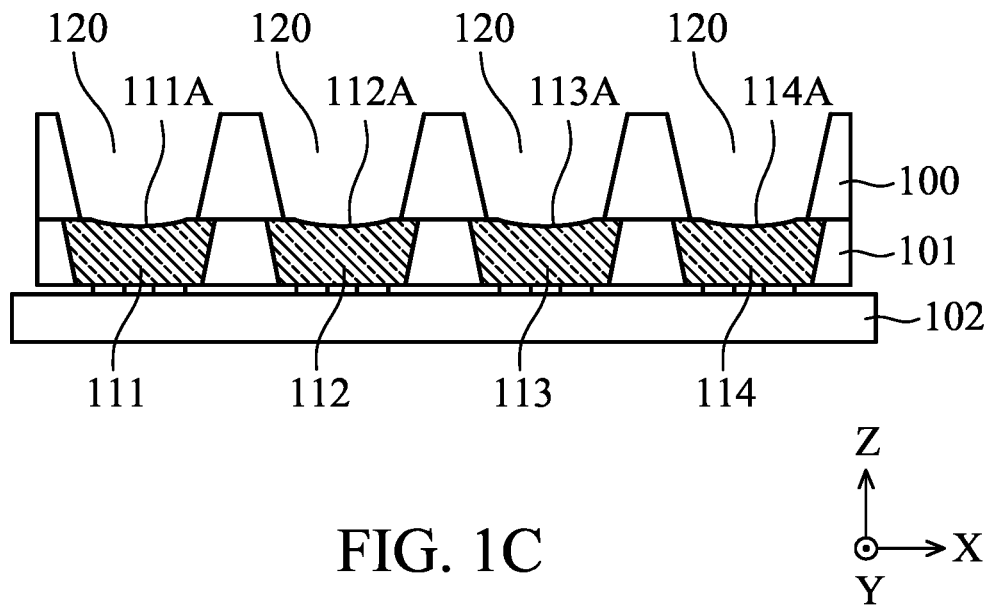

Next, as shown in FIG. 1C, the above structure (including the growth substrate 100, the insulating layer 101, and the light-emitting units 111, 112, 113, and 114) may be turned and may be placed on a carrier substrate 102. In some examples, the carrier substrate 102 may include a circuit, an active component, and/or a passive component. An etching process may be performed on the growth substrate 100 and thereby forming a plurality of openings 120. The openings 120 may be disposed on and expose the light-emitting units 111, 112, 113, and 114, respectively. It should be noted that parameters of the etching process may be adjusted to form curved top surfaces 111A, 112A, 113A, and 114A on the light-emitting units 111, 112, 113, and 114 in order to form a first buffer layer 121, a second buffer layer 122, a third buffer layer 123 and a fourth buffer layer 124 (which may be referred to as "the buffer layers" in the following description) subsequently. The term "expose" of the present disclosure may be referred that at least a portion of one object does not overlap another object in a top view.

It should be noted that after the etching process, the growth substrate 100 may at least partially overlap the light-emitting units 111, 112, 113, and 114 in a top view. Therefore, the light-emitting units 111, 112, 113, and 114 may be fixed stably.

Figure 1D:
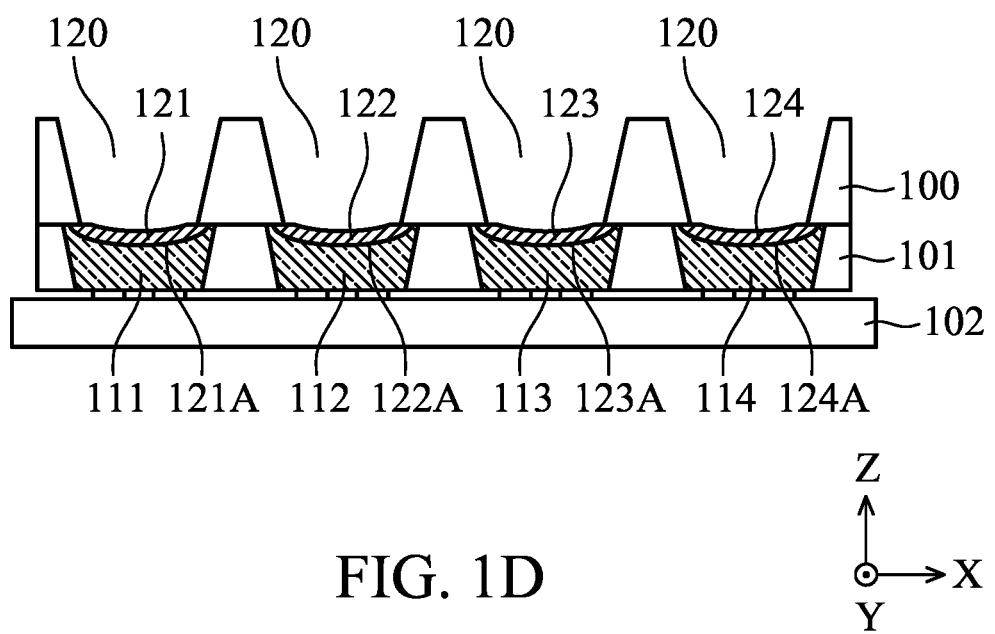

As shown in FIG. 1D, the first buffer layer 121 may be formed on the first light-emitting unit 111, the second buffer layer 122 may be formed on the second light-emitting unit 112, the third buffer layer 123 may be formed on the third light-emitting unit 113, and the fourth buffer layer 124 may be formed on the fourth light-emitting unit 114 (which may be referred to as "the buffer layers" in the following description). Since the buffer layers 121, 122, 123, and 124 are respectively formed on the curved top surfaces 111A, 112A, 113A, and 114A (shown in FIG. 1C) of the light-emitting units 111, 112, 113, and 114, bottom surfaces 121A, 122A, 123A, and 124A of the buffer layers 121, 122, 123, and 124 may be also curved. In some embodiments, the buffer layers 121, 122, 123, and 124 may be formed in the same process, but the present disclosure is not limited thereto. Because of the curved surfaces of the buffer layers 121, 122, 123, and 124, the light emitted by the light-emitting units 111, 112, 113, and 114 may be scattered. Therefore, the quantity of subsequent light conversion may be increased. For example, the material of the buffer layers 121, 122, 123, and 124 may include resin, silicon nitride, silicon oxide, titanium oxide, aluminum oxide, or a combination thereof, but it is not limited thereto.

Figure 1E:
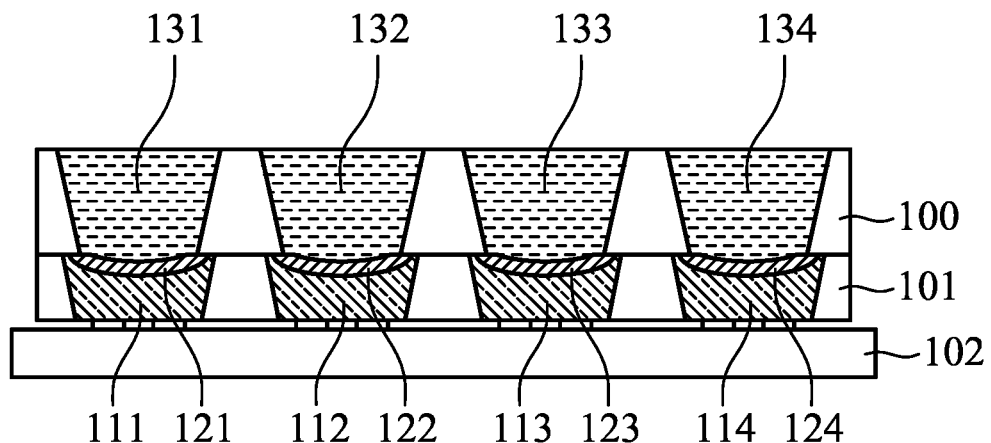

As shown in FIG. 1E, a first light conversion unit 131 may be disposed on the first buffer layer 121, a second light conversion unit 132 may be disposed on the second buffer layer 122, a third light conversion unit 133 may be disposed on the third buffer layer 123, and a fourth light conversion unit 134 may be disposed on the fourth buffer layer 124. For example, the light conversion units may be configured to convert the light emitted by the light-emitting units to light with the same color or different colors, depending on the design requirements. The material of the light conversion units may include a light conversion material and an encapsulation layer. The light conversion material may be encapsulated by the encapsulation layer. In some embodiments, the light-emitting units may emit blue light, and the light conversion units may convert the blue light into red light, green light, blue light, and/or the light with any other colors. By forming the buffer layers between the light-emitting units and the light conversion units, the light conversion units may be protected from the heat, which may be generated by the light-emitting units.

In one example, the first light conversion unit 131 and the fourth light conversion unit 134 may be red light conversion units (convert a light to a red light), the second light conversion unit 132 may be a green light conversion unit, and the third light conversion unit 133 may be a blue light conversion unit, but the present disclosure is not limited thereto. In some other embodiments, the light conversion units 131, 132, 133, and 134 may convert light to another light having substantially the same range of wavelength (namely, light of similar colors).

Figure 1F:
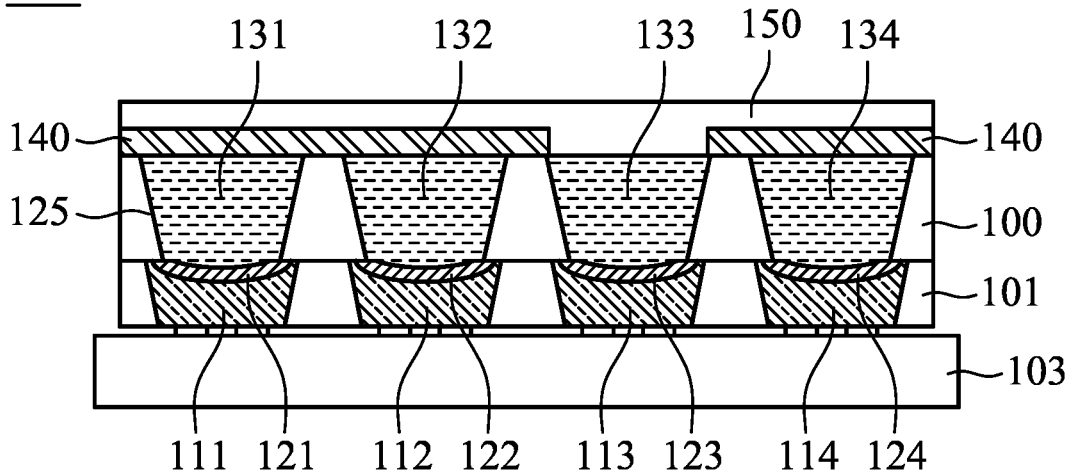

Then, as shown in FIG. 1F, a filter layer 140 may be formed on at least one of the first light conversion unit 131, the second light conversion unit 132, the third light conversion unit 133, and the fourth light conversion unit 134. The filter layer 140 may be configured to filter out a portion of the light, and the other portion of the light with the desired color (i.e. with the desired wavelength range) may pass through the filter layer 140. In addition, the protection layer 150 may be formed on the filter layer 140 and the light conversion units 131, 132, 133 and 134, and the protection layer 150 may be configured to protect the display device 10A.

A pickup device (not shown) may transfer the above structure (shown in FIG. 1E) from the carrier substrate 102 to a substrate 103. It should be appreciated that though the substrate 103 is drawn as a single layer, the substrate 103 may include a circuit with any pattern to electrically connect the light-emitting units 111, 112, 113, and/or 114 as required. Although four light-emitting units are shown in this embodiment, however, the number of light-emitting units is not limited thereto. In addition, in this embodiment, the filter layer 140 and the protection layer 150 may be formed before and/or after the transfer is performed.

Figure 1G:
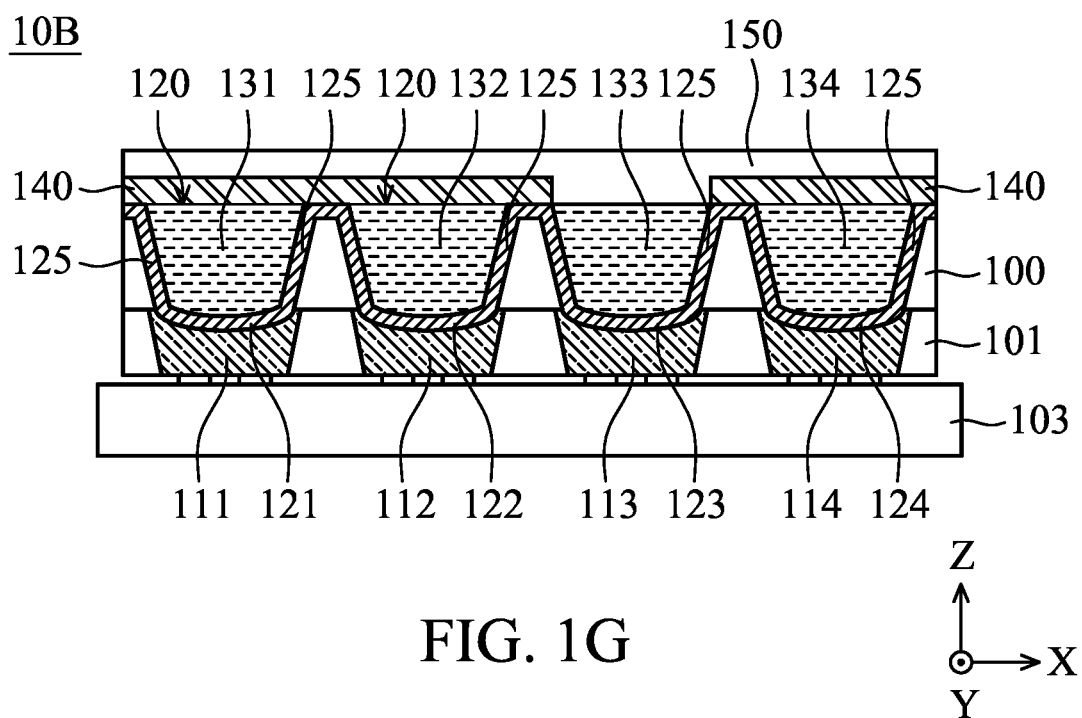

Moreover, as shown in FIG. 1G, another display device 10B is provided, wherein the display device 10B further includes a plurality of sidewall buffer layers 125 connecting the buffer layers 121, 122, 123, and 124. The sidewall buffer layers 125 and the buffer layers 121, 122, 123, and 124 may be formed in the same process. The sidewall buffer layers 125 may be disposed on the sidewalls of the openings 120. In other words, the sidewall buffer layers 125 may be disposed around the light conversion units 131, 132, 133, and/or 134, and extends on the growth substrate 100. Therefore, better protection against heat, water, and/or oxygen may be achieved.

Figure 2A:
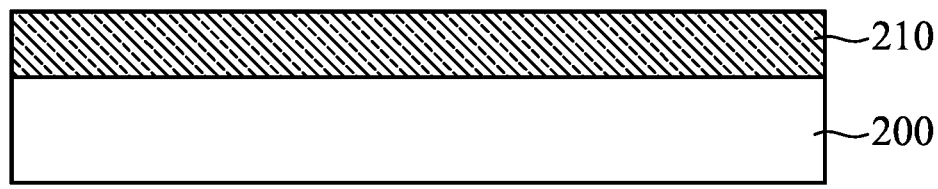
FIGS. 2A-2F are cross-sectional views illustrating the fabrication process of the display device in accordance with some other embodiments of the present disclosure.
Figure 2B:
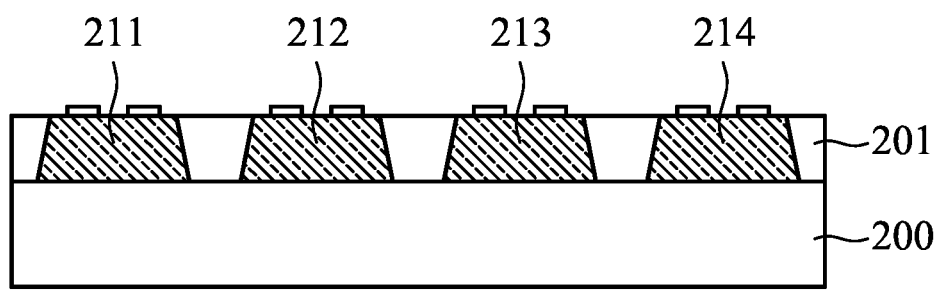
Figure 2C:
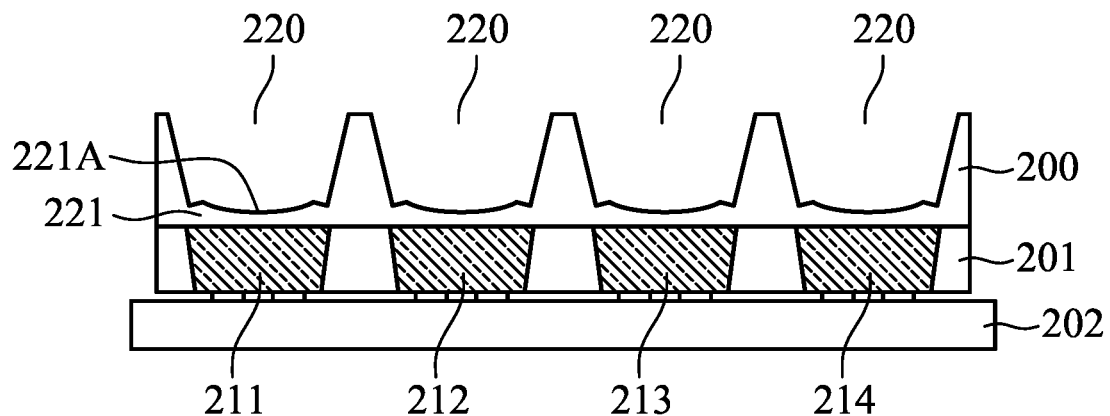
Figure 2D:
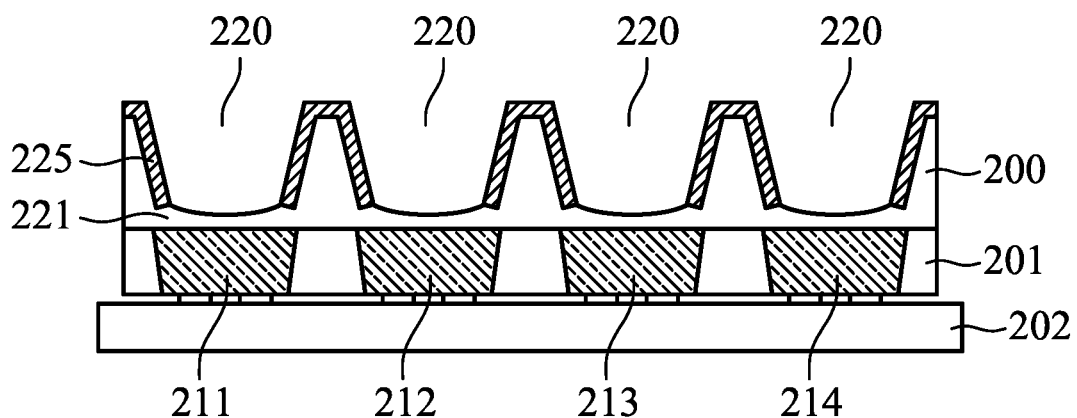

Referring to FIGS. 2A-2F, FIGS. 2A-2F are cross-sectional views illustrating the fabrication process of the display device 20 in accordance with some other embodiments of the present disclosure. Unless described otherwise, it should be noted that the display device 20 in this embodiment may include the same or similar portions as the display device 10A in FIG. 1F, and those portions that are the same or similar will be labeled with similar numerals. For example, the display device 20 may include a growth substrate 200, an insulating layer 201, a substrate 203, a plurality of light-emitting units 211, 212, 213, 214, a plurality of light conversion units 231, 232, 233, 234, a filter layer 240, and a protection layer 250. In addition, a light-emitting layer 210 shown in FIG. 2A may be substantially the same as the light-emitting layer 110 shown in FIG. 1A, and a carrier substrate 202 shown in FIGS. 2C-2E may be substantially the same as the carrier substrate 102 shown in FIGS. 1C-1E. The main difference between the display device 20 in this embodiment and the display device 10A in FIG. 1F is that the growth substrate 200 is a transparent sapphire substrate. As shown in FIG. 2C, an etching process may be performed on the growth substrate 200, thereby forming a plurality of openings 220. The openings 220 do not expose the first light-emitting unit 211, the second light-emitting unit 212, the third light-emitting unit 213, or the fourth light-emitting unit 214, wherein the bottom of the openings 220 is a portion of the growth substrate 200, which may serve as a buffer layer 221 of the display device 20. A top surface 221A of the buffer layer 221 may be curved for improving the optical characteristics of the light passing through the buffer layer 221. Therefore, it may not be required to additionally form any buffer layer on the light-emitting units 211, 212, 213, and 214. Therefore, the fabrication process of the display device 20 may be simplified.

Figure 2E:
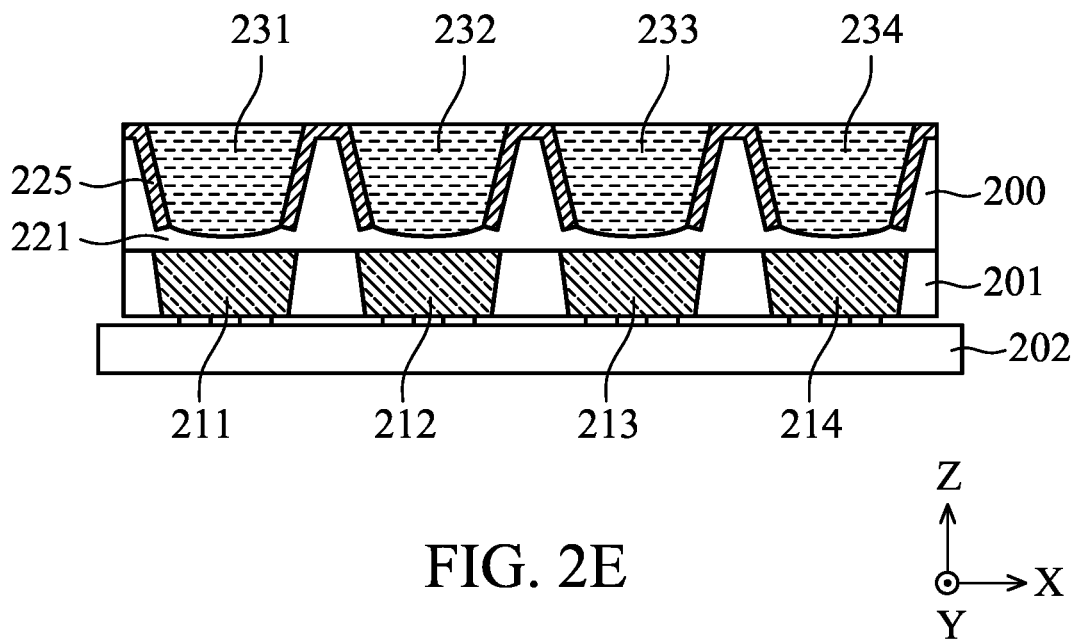

In addition, since the growth substrate 200 may be substantially transparent, a light-shielding layer 225 (shown in FIG. 2D) may be disposed on the growth substrate 200, and extends on sidewalls of the openings 220 and at least a portion of the top surface of the growth substrate 200. In one example, the transmittance of the growth substrate 200 may be greater than 50%. In FIG. 2E, the light-shielding layer 225 may be configured to decrease the mixing lights emitted from adjacent light-emitting units. Moreover, the light-shielding layer 225 may allow the light to be mixed after passing through the light conversion units. For example, the light-shielding layer 225 may be formed by a coating process, and the material of the light-shielding layer 225 may include a black matrix, but it is not limited thereto.

Figure 3A:
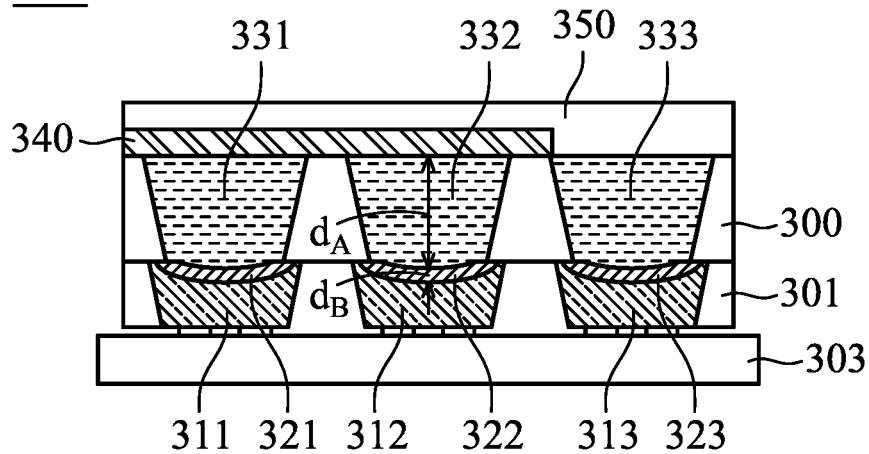
FIG. 3A is a cross-sectional view illustrating the display device in accordance with some embodiments of the present disclosure.
Figure 3B:
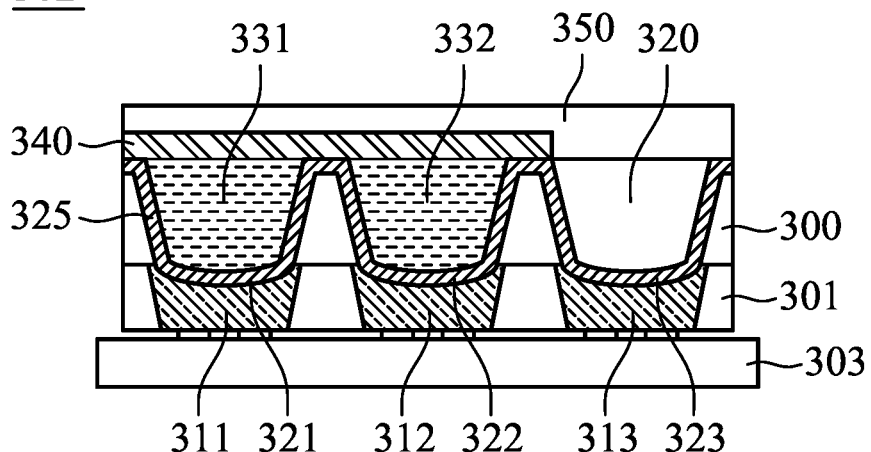
FIG. 3B is a cross-sectional view illustrating the display device in accordance with some other embodiments of the present disclosure.
Figure 3C:
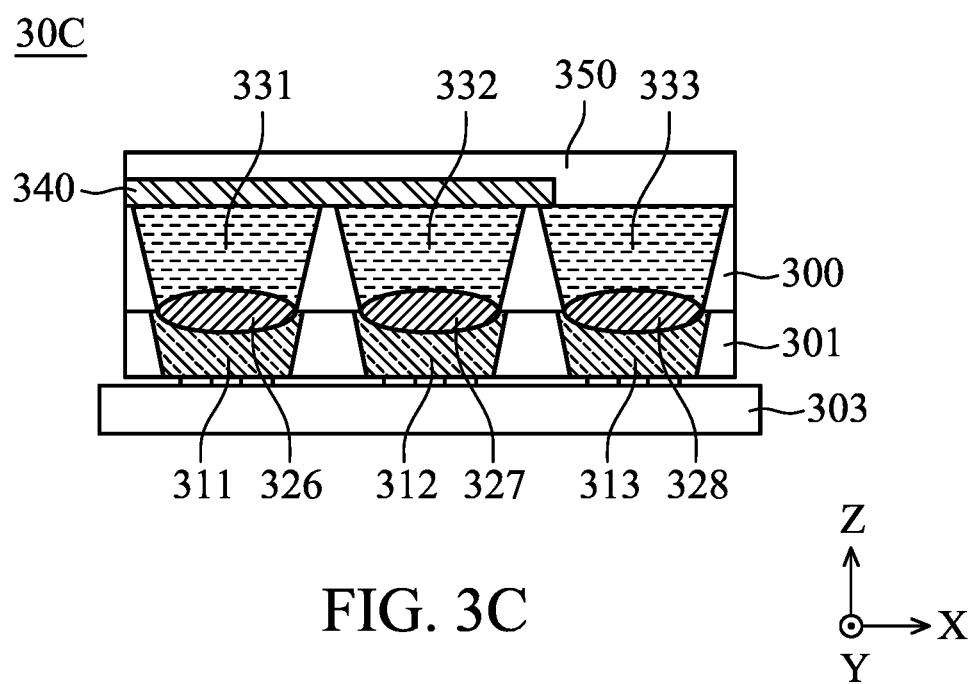
FIG. 3C is a cross-sectional view illustrating the display device in accordance with some other embodiments of the present disclosure.

Next, referring to FIGS. 3A-3C, unless described otherwise, it should be noted that the display device 30A-30C may include the same or similar portions as the display device 10A or 10B, shown in FIG. 1F or 1G, and those portions that are the same or similar will be labeled with similar numerals. For example, the display device 30A may include a growth substrate 300, an insulating layer 301, a substrate 303, a plurality of light-emitting units 311, 312, 313, a plurality of buffer layers 321, 322, 323, a plurality of light conversion units 331, 332, 333, a filter layer 340, and a protection layer 350. As shown in FIG. 3A, three light-emitting units 311, 312, and 313 are illustrated. Also, three corresponding light conversion units 331, 332, and 333 are illustrated. For example, the light-emitting units 311, 312, and 313 are configured to emit blue light, and the first light conversion units 331, 332, and 333 may be respectively configured to convert the light into red light, green light, and blue light, but the present disclosure is not limited therein. In various embodiments, the display device may include a number of light-emitting units and corresponding light conversion units, wherein the above number is greater than three, and may be a multiple of three. Accordingly, the display devices in the following description are illustrated with three light-emitting units and corresponding light conversion units.

The light conversion units (such as the second light conversion unit 332) may have a thickness $d_A$. If the thickness $d_A$ of the light conversion units is too thin, the light conversion efficiency may suffer. However, if the thickness $d_A$ is too thick, a portion of the converted light may be absorbed by the light conversion unit. In addition, the buffer layers (such as the second buffer layer 322) may have a thickness $d_B$. If the thickness $d_B$ of the buffer layers is too thin, the buffer layers may be not uniform, or disconnected from each other. Therefore, the protection against heat, water, and/or oxygen may be affected. However, if the thickness $d_B$ is too thick, a portion of the light from the light-emitting units may be absorbed by the buffer layers. Accordingly, it is provided that the ratio of the thickness $d_A$ and the thickness $d_B$ may be in a range from 0.2 to 100. In some embodiments, the ratio of the thickness $d_A$ and the thickness $d_B$ may be in a range from 0.6 to 80, but it is not limited thereto. The thickness $d_A$ of the light conversion units may be measured from the central region of the light conversion units along the normal direction (e.g. the Z direction) of the substrate 303. Similarly, the thickness $d_B$ of the buffer layers may be measured from the central region of the buffer layers along the normal direction (e.g. the Z direction) of the substrate 303. The present disclosure is not limited thereto.

Referring to FIG. 3B, the main difference between the display device 30B in FIG. 3B and the display device 10B in FIG. 1G is that as the third light-emitting unit 313 emits blue light, the third light conversion unit 333, which may be configured to convert the light into blue light, may be omitted. Therefore, an opening 320 may be disposed between the protection layer 350 and the buffer layer 323. The light emitted by the third light-emitting unit 313 may not be absorbed because there is no light conversion unit corresponding to the third light-emitting unit 313, and the overall brightness of the display device 30B may be increased.

Referring to FIG. 3C, the main difference between the display device 30C in FIG. 3C and the display device 30A in FIG. 3A is that the buffer layers 326, 327, and 328 may be respectively disposed on the light-emitting units 311, 312, and 313 by an inkjet process. Therefore, top surfaces of the buffer layers 326, 327, and 328 may be convex towards the first light conversion unit 331, the second light conversion unit 332, and the third light conversion unit 333, respectively.

Figure 4:
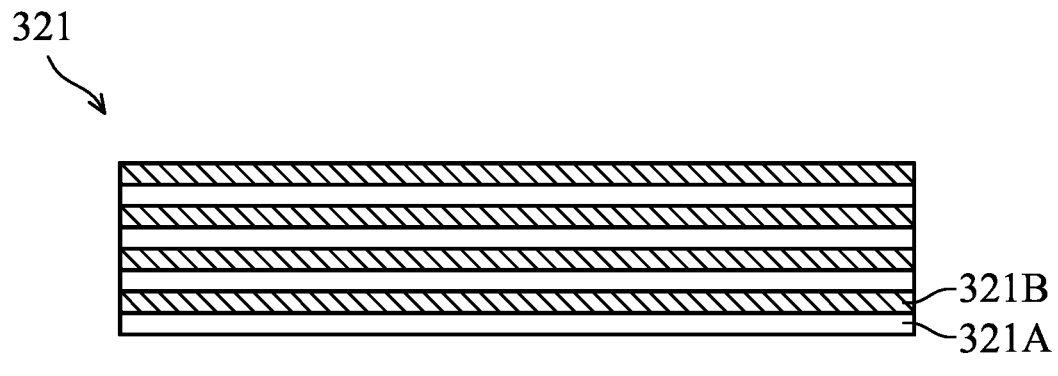
FIG. 4 is a cross-sectional view illustrating a buffer layer in accordance with some embodiments of the present disclosure.

Referring to FIG. 4, FIG. 4 is a cross-sectional view illustrating the first buffer layer 321 in accordance with some embodiments of the present disclosure. The first buffer layer 321 may be a multi-layered structure, wherein the first sub-layer 321A and the second sub-layer 321B may be stacked alternately. The refraction index of the first sub-layer 321A and the refraction index of the second sub-layer 321B may be different. For example, the refraction index of the first sub-layer 321A may be greater than the refraction index of the second sub-layer 321B. Therefore, light having a certain range of wavelength (e.g. a range of wavelength of blue color, red color, or green color) may pass through the multi-layered structure, and the light with other ranges of wavelength may be reflected. Therefore, the light conversion efficiency may be increased. It should be understood that the first buffer layer 321 in this embodiment is merely an example, the above multi-layered structure may be applied to any of the buffer layers described above or below, and the structure of the first buffer layer 321 is not limited thereto.

Figure 5:
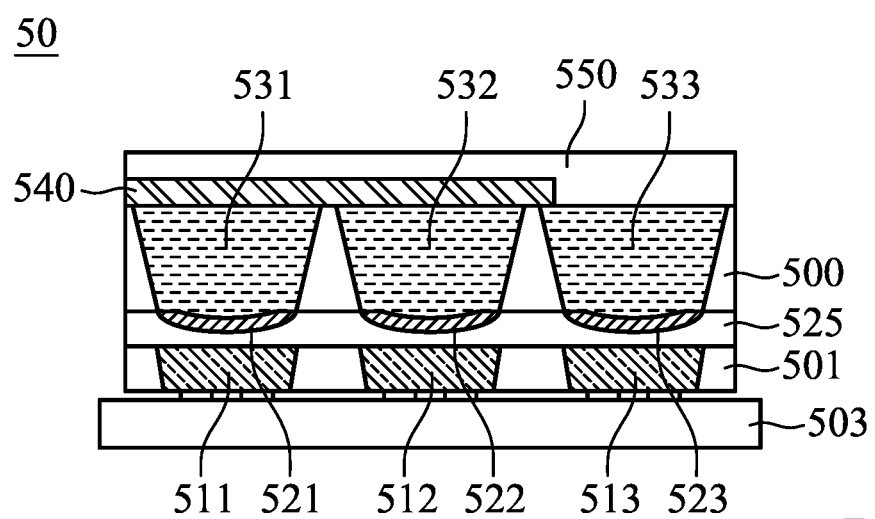
FIG. 5 is a cross-sectional view illustrating the display device in accordance with some other embodiments of the present disclosure.

Referring to FIG. 5, FIG. 5 is a cross-sectional view illustrating the display device 50 in accordance with some other embodiments of the present disclosure. Unless described otherwise, it should be noted that the display device 50 in this embodiment may include the same or similar portions as the display device 10A in FIG. 1F, and those portions that are the same or similar will be labeled with similar numerals. For example, the display device 50 include a growth substrate 500, an insulating layer 501, a substrate 503, a plurality of light-emitting units 511, 512, 513, a plurality of buffer layers 521, 522, 523, a plurality of light conversion units 531, 532, 533, a filter layer 540, and a protection layer 550. The display device 50 further includes a neutral layer 525, which may be disposed between the light-emitting units 511, 512, 513 and the growth substrate 500. The neutral layer 525 may be etched to form a partially curved surface for the subsequent buffer layers 521, 522, and 523. For example, the material of the neutral layer 525 may be a non-dopant material, such as a non-dopant low temperature aluminum nitride (AlN) or gallium nitride (GaN). Because of the neutral layer 525, the protection of the light conversion units and the light-emitting units may be enhanced.

Figure 6A:
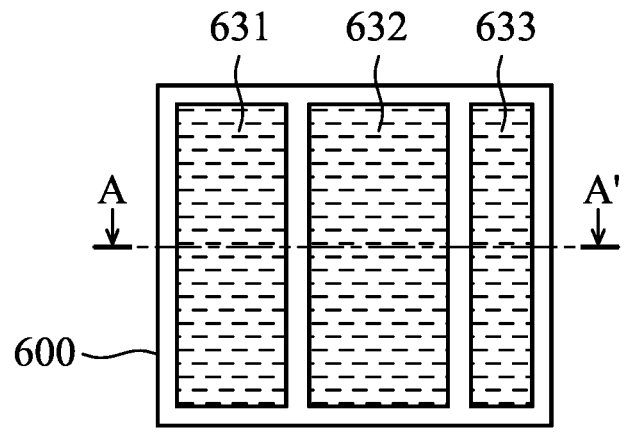
FIG. 6A is a top view illustrating the display device in accordance with some other embodiments of the present disclosure.

Referring to FIG. 6A, FIG. 6A is a top view illustrating the display device 60 in accordance with some embodiments of the present disclosure. It should be noted that for the sake of clarity, the aforementioned filter layer and the protection layer are not illustrated in FIG. 6A. Therefore, in FIG. 6A, only a growth substrate 600 and a plurality of light conversion units 631, 632, 633 are shown. The amounts of the lights after passing through the light conversion units 631, 632, and 633 may be different. In the display device 60, the first light conversion unit 631 (which is, for example, configured to convert the light into red light), the second light conversion unit 632 (which is, for example, configured to convert the light into green light), and the third light conversion unit 633 (which is, for example, configured to convert the light into blue light) may have different sizes. For example, at least one of the size of the first light conversion unit 631 and the size of the second light conversion unit 632 may be greater than the size of the third light conversion unit 633, but the present disclosure is not limited thereto. In some other embodiments, the sizes of the light conversion units 631, 632, and 633 may be adjusted as required.

Figure 6B:
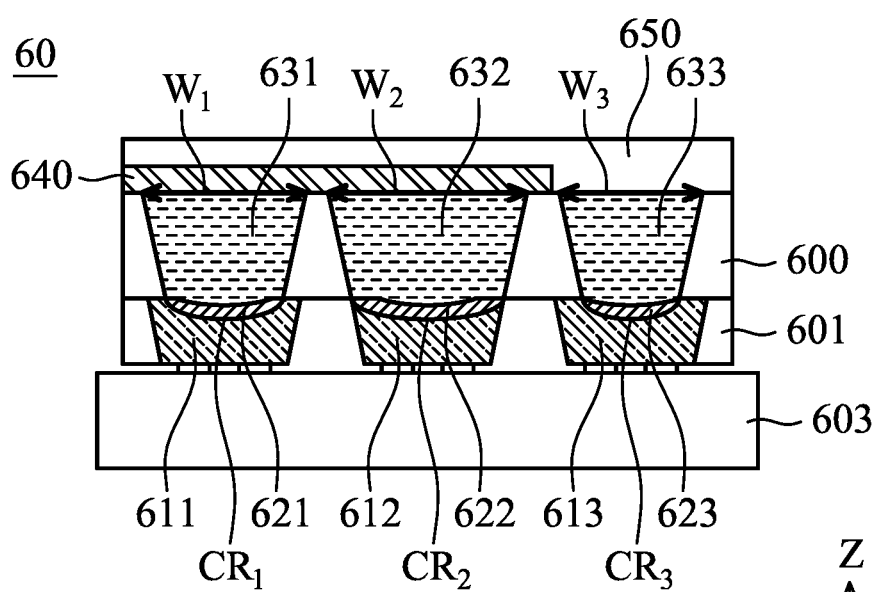
FIG. 6B is a cross-sectional view along line A-A' in FIG. 6A.

FIG. 6B is a cross-sectional view along line A-A' in FIG. 6A. Unless described otherwise, it should be noted that the display device 60 in this embodiment may include the same or similar portions as the display device 30A in FIG. 3A, and those portions that are the same or similar will be labeled with similar numerals. For example, the display device 60 may include a growth substrate 600, an insulating layer 601, a substrate 603, a plurality of light-emitting units 611, 612, 613, a plurality of buffer layers 621, 622, 623, a plurality of light conversion units 631, 632, 633, a filter layer 640, and a protection layer 650. As shown in FIG. 6B, the top surface of the first light conversion unit 631 may have a first width $W_1$, the top surface of the second light conversion unit 632 may have a second width $W_2$, and the top surface of the third light conversion unit 633 may have a third width $W_3$, wherein the second width $W_2$ may be greater than the first width $W_1$, and the first width $W_1$ may be greater than the third width $W_3$. In some embodiments, the bottom of the first buffer layer 621 may have a first curvature $CR_1$, the bottom of the second buffer layer 622 may have a second curvature $CR_2$, and the bottom of the third buffer layer 623 may have a third curvature $CR_3$, wherein the second curvature $CR_2$ is less than the first curvature $CR_1$, and the first curvature $CR_1$ may be less than the third curvature $CR_3$. By setting the above relationship between the above widths and/or the curvatures, the light output characteristics may be tuned, and the performance of the display device may be improved.

Figure 7:
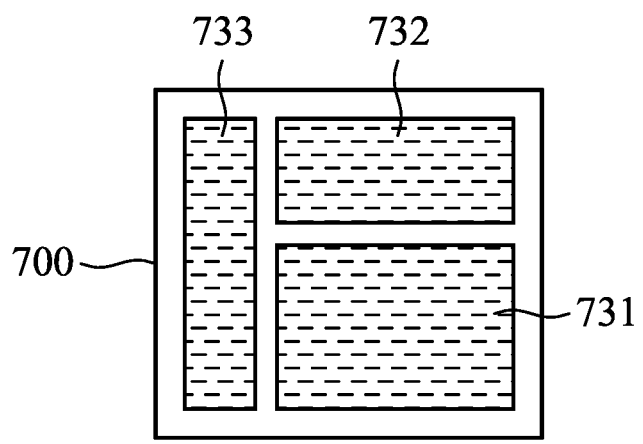
FIG. 7 is a top view illustrating the display device in accordance with some other embodiments of the present disclosure.

As shown in FIG. 7, FIG. 7 is a top view illustrating the display device 70 in accordance with some other embodiments of the present disclosure. It should be noted that for the sake of clarity, the aforementioned filter layer and the protection layer are not illustrated in FIG. 7. Therefore, in FIG. 7, only a growth substrate 700 and a plurality of light conversion units 731, 732, 733 are shown. For the reason as introduced above, the sizes of the light conversion units 731, 732, and 733 may be different. In some example, the area of the top surfaces of the light conversion units 731, 732 and 733 may be different. As shown in FIG. 7, the light conversion units 731, 732, and 733 may not be arranged along a single direction (such as the line A-A' shown in FIG. 6A), and may be arranged arbitrarily depending on the design requirements.

Figure 8:
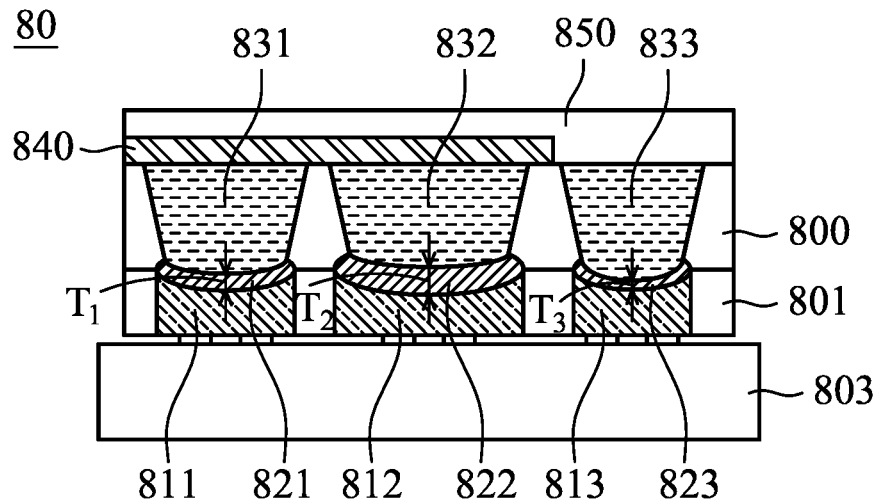
FIG. 8 is a cross-sectional view illustrating the display device in accordance with some other embodiments of the present disclosure.

As shown in FIG. 8, unless described otherwise, it should be noted that the display device 80 in this embodiment may include the same or similar portions as the display device 10A in FIG. 1F, and those portions, which are the same or similar, will be labeled with similar numerals. For example, the display device 80 may include a growth substrate 800, an insulating layer 801, a substrate 803, a plurality of light-emitting units 811, 812, 813, a plurality of buffer layers 821, 822, 823, a plurality of light conversion units 831, 832, 833, a filter layer 840, and a protection layer 850. The main difference between the display device 80 in FIG. 8 and the display device 10A in FIG. 1F is that the thicknesses of the buffer layers 821, 822, and 823 may be different. For example, a second thickness $T_2$ of the second buffer layer 822 may be greater than a first thickness $T_1$ of the first buffer layer 821. The first thickness $T_1$ of the first buffer layer 821 may be greater than a third thickness $T_3$ of the third buffer layer 823, but the present disclosure is not limited therein. Those skilled in the art may adjust these thicknesses of the buffer layers 821, 822, and 823 based on the requirements of the optical characteristics. The thicknesses of the buffer layers may be measured from the central region of the buffer layers along the normal direction (e.g. the Z direction) of the substrate 803.

Figure 9:
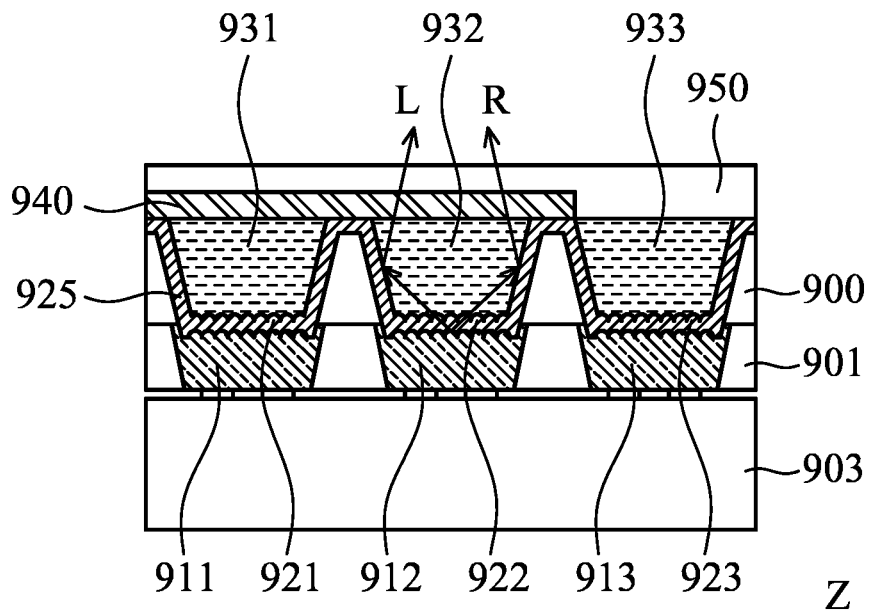
FIG. 9 is a cross-sectional view illustrating the display device in accordance with some other embodiments of the present disclosure.

As shown in FIG. 9, unless described otherwise, it should be noted that the display device 90 in this embodiment may include the same or similar portions as the display device 10B shown in FIG. 1G, and those portions that are the same or similar will be labeled with similar numerals. For example, the display device 90 may include a growth substrate 900, an insulating layer 901, a substrate 903, a plurality of light-emitting units 911, 912, 913, a plurality of buffer layers 921, 922, 923, a plurality of light conversion units 931, 932, 933, a filter layer 940, and a protection layer 950. The main difference between the display device 90 in FIG. 9 and the display device 10B in FIG. 1G is that the top surfaces of the light-emitting units 911, 912, and 913 may be etched to be rough. Therefore, the bottom and/or top surfaces of the buffer layers 921, 922, and 923 may be also rough. For example, the light, which is shown as arrows L and/or R, may pass through the rough surfaces of the buffer layers 921, 922, and 923, and the light may be reflected by a sidewall buffer layer 925.

Figure 10:
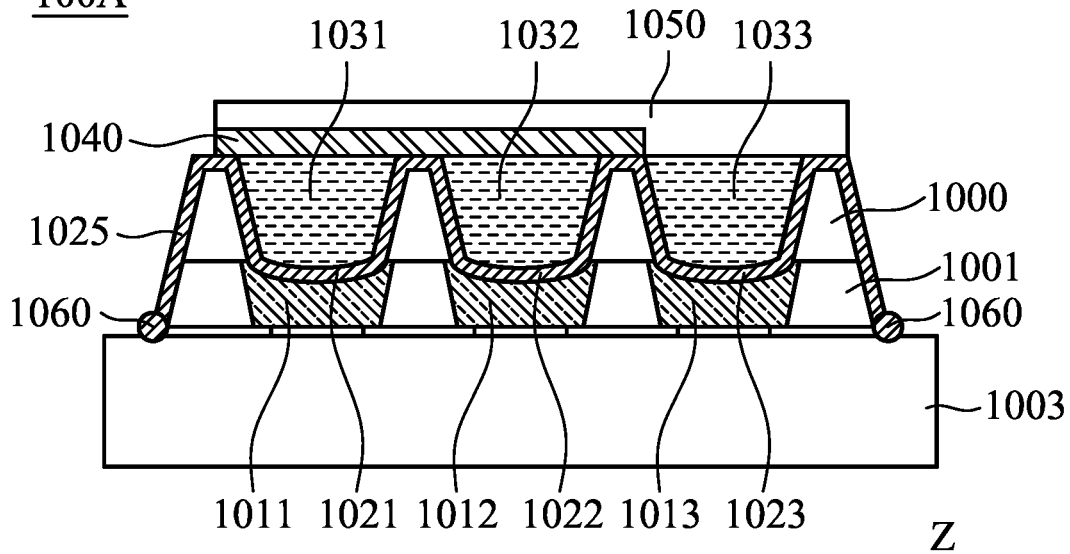
FIG. 10 is a cross-sectional view illustrating the display device in accordance with some other embodiments of the present disclosure.

As shown in FIG. 10, unless described otherwise, it should be noted that the display device 100A in this embodiment may include the same or similar portions as the display device 10B in FIG. 1G, and those portions that are the same or similar will be labeled with similar numerals. For example, the display device 100A may include a growth substrate 1000, an insulating layer 1001, a substrate 1003, a plurality of light-emitting units 1011, 1012, 1013, a plurality of buffer layers 1021, 1022, 1023, a plurality of light conversion units 1031, 1032, 1033, a filter layer 1040, and a protection layer 1050. The main difference between the display device 100A in FIG. 10 and the display device 10B in FIG. 1G is that the display device 100A further includes at least one electrical contact 1060 disposed on the substrate 1003. The sidewall buffer layer 1025 may connect the buffer layers 1021, 1022, and 1023, and may be electrically connected to the at least one electrical contact 1060. In this embodiment, the buffer layers 1021, 1022, and 1023 may be configured to serve as an electrode, which may be the upper electrode of the light-emitting units 1011, 1012, and 1013. That way, at the bottom of the light-emitting units 1011, 1012, and 1013, merely one electrode has to be disposed below the light-emitting units 1011, 1012, and 1013. Therefore, the manufacturing process of the electrode of the light-emitting units may be performed more easily, and the relevant cost may be reduced. In one embodiment, the light-emitting units 1011, 1012, and 1013 may respectively have an upper electrode (not shown) in contact with the buffer layers 1021, 1022, and 1023. For example, in some embodiments, the material of the buffer layers 1021, 1022, 1023, and 1025 may be a thermal conductive material, such as thermal conductive silicone or graphite, but it is not limited thereto. In some other embodiments, the material of the buffer layers 1021, 1022, 1023, and 1025 may be a transparent and conductive material, such as indium tin oxide (ITO), graphene, nano silver (Ag), nano gold (Au), nano nickel (Ni), but it is not limited thereto.

Figure 2F:
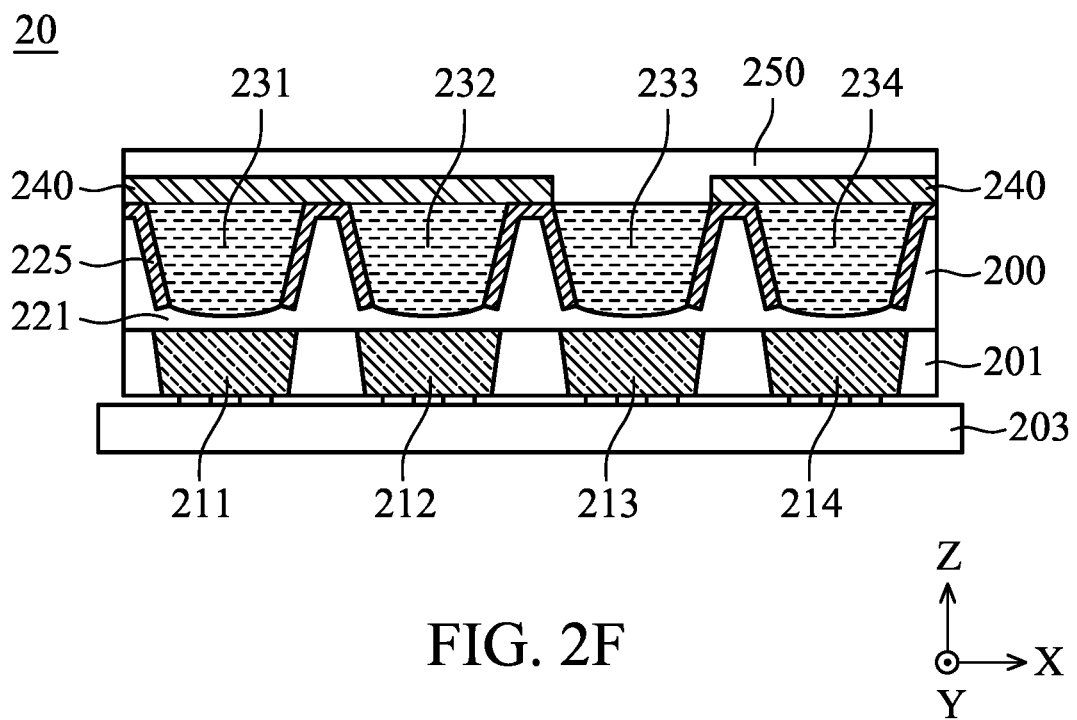

As shown in FIG. 11, unless described otherwise, it should be noted that the display device 110A in this embodiment may include the same or similar portions as the display device 20 in FIG. 2F, and those portions that are the same or similar will be labeled with similar numerals. For example, the display device 110A may include a growth substrate 1100, an insulating layer 1101, a substrate 1103, a plurality of light-emitting units 1111, 1112, 1113, a plurality of buffer layers 1121, 1122, 1123, a plurality of light conversion units 1131, 1132, 1133, a filter layer 1140, and a protection layer 1150. The main difference between the display device 110A in FIG. 11 and the display device 20 in FIG. 2F is that the buffer layer 1121 (the bottom portion of the growth substrate 1100) may have different thicknesses (such as the thicknesses $T_A$, $T_B$, and $T_C$ shown in FIG. 11) on the light-emitting element 1111, 1112, and 1113, respectively. In addition, the light-shielding layer 1126 (such as a black matrix) may be filled into the holes formed in the growth substrate 1100.

As described above, some embodiments of the present disclosure provide a display device, wherein a buffer layer is disposed between light-emitting units and light conversion units. Therefore, the light conversion units may be protected from the heat emitted by the light-emitting units, and the lifetime and the light conversion efficiency of the light conversion units may be increased. Moreover, according to some embodiments of the present disclosure, the thickness, roughness, curvature, and materials of the buffer layer may be adjustable to optimize the optical characteristics of the light emitted by the display device.

It should be noted that the aforementioned sizes, parameters and shapes of the elements are not limitations of the present disclosure. Those skilled in the art may adjust these settings according to different needs. Moreover, the substrates, display devices and the methods for manufacturing the same are not limited to the configurations shown in FIGS. 1A-11. Some embodiments of the present disclosure may just include any one or more features of any one or more embodiment of FIGS. 1A-11. That is to say, not every feature of all the drawings is performed in the substrates, display devices and the methods for manufacturing the same of the present disclosure.

While the disclosure has been described by way of example and in terms of preferred embodiment, it is to be understood that those skilled in the art may make various changes, substitutions, and alterations to the disclosure without departing from the spirit and scope of the present disclosure. In addition, the scope of the present disclosure is not limited to the process, machines, manufacture, composition, devices, methods and steps in the specific embodiments described in the specification. Those skilled in the art will understand that existing or developing processes, machines, manufacture, composition, devices, methods, and steps may be performed in the aforementioned embodiments, as long as they can obtain substantially the same result, in accordance with some embodiments of the present disclosure. Therefore, the scope of the present disclosure includes the aforementioned processes, machines, manufacture, composition, devices, methods and steps. Furthermore, each of the appended claims constructs an individual embodiment, and the scope of the present disclosure also includes every combination of the appended claims and embodiments.

What is claimed is:

1. An electronic device, comprising:
   a substrate;
   a first light-emitting unit disposed on the substrate;
   a first light conversion unit disposed on the first light-emitting unit; and
   a first buffer layer disposed between the first light conversion unit and the first light-emitting unit,
   wherein a thickness of the first light conversion unit is greater than a thickness of the first light-emitting unit,
   wherein a ratio of the thickness of the first light conversion unit to a thickness of the first buffer layer is in a range from 0.2 to 100,
   wherein the first light conversion unit has a curved surface and the curved surface is in contact with the first buffer layer.

2. The electronic device as claimed in claim 1, further comprising:
   a second light-emitting unit disposed adjacent to the first light-emitting unit; and
   a second light conversion unit disposed on the second light-emitting unit.

3. The electronic device as claimed in claim 2, wherein a width of the first light conversion unit is different from a width of the second light conversion unit.

4. The electronic device as claimed in claim 2, further comprising a light-shielding layer disposed between the first light conversion unit and the second light conversion unit.

5. The electronic device as claimed in claim 2, further comprising a filter layer disposed on at least one of the first light conversion unit and the second light conversion unit.

6. The electronic device as claimed in claim 2, further comprising a second buffer layer disposed between the second light conversion unit and the second light-emitting unit, and the thickness of the first buffer layer is different from a thickness of the second buffer layer.

7. The electronic device as claimed in claim 1, wherein the first buffer layer has a curved surface.

8. The electronic device as claimed in claim 1, further comprising a protective layer disposed on the first conversion unit, wherein the first conversion unit is disposed between the protective layer and the first buffer layer.

9. The electronic device as claimed in claim 1, further comprising:
   a second light-emitting unit disposed on the substrate and adjacent to the first light-emitting unit; and
   an insulating layer disposed between the first light-emitting unit and the second light-emitting unit, wherein in a cross-sectional view, the insulating layer has an upper surface and a bottom surface, the upper surface has an upper width, the bottom surface has a bottom width, and the bottom width is larger than the upper width.

* * * * *